(12) United States Patent
Javerliac et al.

(10) Patent No.: US 8,228,703 B2
(45) Date of Patent: Jul. 24, 2012

(54) TERNARY CONTENT ADDRESSABLE MAGNETORESISTIVE RANDOM ACCESS MEMORY CELL

(75) Inventors: Virgile Javerliac, Grenoble (FR); Mourad El Baraji, Saint Martin d'Heres (FR)

(73) Assignee: Crocus Technology SA, Grenoble (FR)

( * ) Notice: Subject to any disclaimer, the term of this patent is extended or adjusted under 35 U.S.C. 154(b) by 337 days.

(21) Appl. No.: 12/609,602

(22) Filed: Oct. 30, 2009

(65) Prior Publication Data

US 2010/0110744 A1    May 6, 2010

(30) Foreign Application Priority Data

Nov. 4, 2008 (EP) ..................... 08291025

(51) Int. Cl.
*G11C 15/00* (2006.01)
*G11C 15/02* (2006.01)
(52) U.S. Cl. ..................... 365/49.17; 365/50
(58) Field of Classification Search ............... 365/49.17, 365/50
See application file for complete search history.

(56) References Cited

U.S. PATENT DOCUMENTS

| 5,695,864 | A | 12/1997 | Slonczewski |
| 6,256,222 | B1 | 7/2001 | Sakakima et al. |
| 6,603,677 | B2 | 8/2003 | Redon et al. |
| 6,950,335 | B2 | 9/2005 | Dieny et al. |
| 7,894,228 | B2 * | 2/2011 | Nozieres et al. ............ 365/50 |
| 8,023,299 | B1 * | 9/2011 | Gharia ............ 365/49.1 |
| 2006/0067097 | A1 * | 3/2006 | Lien et al. ............ 365/49 |
| 2006/0291276 | A1 | 12/2006 | Nozieres et al. |
| 2007/0002618 | A1 | 1/2007 | Schoenauer et al. |
| 2008/0084724 | A1 * | 4/2008 | Nozieres et al. ............ 365/50 |
| 2008/0197431 | A1 | 8/2008 | Morise et al. |
| 2009/0251957 | A1 | 10/2009 | Javerliac et al. |

FOREIGN PATENT DOCUMENTS

| WO | 03077257 A1 | 9/2003 |
| WO | 2008040561 A2 | 4/2008 |

OTHER PUBLICATIONS

E.B. Myers, D.C. Ralph, J.A. Katine, R.N. Louie, R.A. Buhrman: "Current-Induced Switching of Domains in Magnetic Multilayer Devices", Science, vol. 285, No. 5429, Aug. 6, 1999, pp. 867-870.
Prenat G, Mourad; Buda-Prejbeanu, Liliana; Javerliac, Virgile; Zhao, Weisheng: "CMOS/Magnetic Hybrid Architectures", Electronics, Circuits and Systems, 2007. ICECS 2007. 14th IEEE International Conference on, IEEE, Piscataway, NJ., USA, Dec. 11, 2007, pp. 190-193.

(Continued)

*Primary Examiner* — Ly D Pham
(74) *Attorney, Agent, or Firm* — Pearne & Gordon LLP

(57) ABSTRACT

A method for writing a magnetic random access memory-based ternary content addressable memory cell comprising a first magnetic tunnel junction being formed from a storage layer, a sense layer having a magnetization direction adjustable relative to the magnetization of the storage layer, and an insulating layer between the storage and sense layers; a sense line coupled with the storage layer; a first field line and a second field line, and the first field line being orthogonal to the second field line; comprising: providing a first write data to said storage layer via the second field line to store a first stored data with a high or low logic state; characterized in that, the method further comprises providing the first write data to said storage layer via the first field line to store the first stored data with a masked logic state.

15 Claims, 7 Drawing Sheets

OTHER PUBLICATIONS

Uemura, T; Marukame, T; Matsuda, K.-i; Yamamoto, M.: "Four-States Magnetic Random Access Memory and Ternary Content Addressable Memory Using CoFe-based Magnetic Tunnel Junctions", Multiple-Valued Logic, 2007. ISMVL 2007. 37th International Symposium on, IEEE, PI, May 1, 2007, pp. 49-49.

Xu, Wei; Zhang, tong; Chen, Yiran: "Spin-Transfer Torque Magnetoresistive Content Addressable Memory (CAM) Cell Structure Design with Enhanced Search Noise Margin", Circuits and Systems, 2008. ISCAS 2008. IEEE International Symposium on, IEEE, Piscataway, NJ, USA, May 18, 2008, pp. 1898-1901.

Dieny, B.; Sousa; R., Prenat, G.; Ebels, U.: "Spin-Dependent Phenomena and Their Implementation in Spintronic Devices", VLSI Technology, Systems and Applications, 2008. VLSI-TSA 2008. International Symposium on, IEEE, Piscataway, NJ, USA, Apr. 21, 2008, pp. 70-21.

European Search Report for EP09174930, dated Apr. 23, 2010.

E.B. Myers, D.C. Ralph, J.A. Katine, R.N. Louie, R.A. Buhrman: "Current-Induced Switching of Domains in Magnetic Multilayer Devices", vol. 285, No. 5429, pp. 867-870 (Abstract), Aug. 6, 1999.

* cited by examiner

TERNARY CONTENT ADDRESSABLE MAGNETORESISTIVE RANDOM ACCESS MEMORY CELL

FIELD OF THE INVENTION

The present disclosure relates generally to magnetic random access memory (MRAM) and more particularly, but not exclusively, to ternary content-addressable random access memory having magnetic tunnel junction (MTJ)-based memory cells.

DESCRIPTION OF RELATED ART

Content Addressable Memory (CAM) is an outgrowth of Random Access memory (RAM) technology. Unlike RAMs which access a word based on its address, CAMs access a word based on its contents. A CAM stores data in a similar fashion to a conventional RAM. However, "reading" the CAM involves providing input data to be matched, then searching the CAM for a match so that the address of the match can be output. A CAM is designed such that the user supplies a data word and the CAM searches its entire memory in one-clock cycle to see if that data word is stored anywhere in it. If the data word is found, the CAM returns a list of one or more storage addresses where the word was found. The CAM can be preloaded at device start-up and rewritten during device operation.

To search the entire memory quickly, CAM employs separate match logic per each memory row. When a search key is presented by the user, each search key bit will become visible to all the match logic cells in a column at the same time. Each row of match logic cells will then perform a bit-by-bit comparison between the provided search key and the stored key in the associated memory row. Comparison results will be reduced to a binary value (e.g., 1 for match and 0 for mismatch) and are fed into a priority encoder, which finally produces the search result. Since comparisons for all the memory rows are performed in parallel, CAM achieves high-bandwidth, constant-time search performance.

CAMs, and specifically Ternary CAMs (TCAMs), are also mostly used in networking devices. They provide read and write such as normal memory, but additionally support search which will find the index of any matching data in the entire memory. A TCAM in particular can include wildcard bits which will match both one and zero. Theses wildcards can be used on both the access operations of the memory (indicating some bits of the search are "don't cares") or can be stored with the data itself (indicating some bits of the data should not be used for determining a match). When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Therefore a TCAM can perform a partial matching. The fully parallel search provided by TCAM eases the implementation of many complex operations such as routing table lookup. Because the TCAM searches every location in memory at once, the ordering of the element in the TCAM is less important, and large indexing structures can often be entirely avoided. This parallel search directly implements the requirements of some applications (such IP-Lookup), and can serve as the building block of more searching schemes. TCAM is also used in other high-speed networking applications such as packet classification, access list control, pattern matching for intrusion detection. TCAM are also being used with network processors as a co-processor to complement the network processors in several applications such as packet classification and routing lookup.

A typical implementation of a static random access memory (SRAM) TCAM cell consists of a ternary storage containing two SRAM cells which combines ten to twelve transistors. It also has a comparison logic, which is basically a XNOR gate using four additional pass transistors. Hence, such cells can be very large, having typically fourteen to sixteen transistors, making them a costly device. A schematic representation of a conventional state-of-the-art SRAM-based TCAM cell is depicted in FIG. 1. The TCAM cell of FIG. 1 is provided as a two standard SRAM cells with four or more transistors designed to implement the exclusive-OR (EOR) function.

Unlike a RAM chip, which has simple storage cells, each individual memory bit in a fully parallel TCAM has its own associated comparison circuit to detect a match between the stored data bit and the input data bit. TCAM chips are thus considerably smaller in storage capacity than regular memory chips. Additionally, match outputs from each cell in the data word can be combined to yield a complete data word match signal. The associated additional circuitry further increases the physical size of the TCAM chip. Furthermore, CAM and TCAM as it is produced today (using SRAM elements) is intrinsically volatile, meaning that the data are lost when the power is turned off. As a result, every comparison circuit needs being active on every clock cycle, resulting in large power dissipation. With a large price tag, high power and intrinsic volatility, TCAM is only used in specialized applications where searching speed cannot be accomplished by using a less costly method.

Emerging memory technology and high-speed lookup-intensive applications are demanding ternary content addressable memories with large word sizes, which suffer from lower search speeds due to large cell capacitance.

BRIEF SUMMARY OF THE INVENTION

The present disclosure concerns a method for writing and searching a magnetic random access memory-based ternary content addressable memory (MRAM-based TCAM) which overcomes at least some limitations of the prior art.

According to the embodiments, these aims are achieved by means of a method for writing a MRAM-based TCAM cell comprising: a first magnetic tunnel junction being formed from a storage layer having a magnetization, a sense layer having a magnetization direction adjustable relative to the magnetization of the storage layer, and an insulating layer between the storage and sense layers; a sense line coupled with the storage layer; a first field line and a second field line, both field lines being in communication with the storage and sense layers, and the first field line being orthogonal to the second field line; comprising: providing a first write data to said storage layer via the second field line to store a first stored data with a high or low logic state; characterized in that, the method further comprises providing the first write data to said storage layer via the first field line to store the first stored data with a masked logic state.

In an embodiment, said providing the first write data via the second field line comprises including the first write data in a second field current adapted to switch the magnetization of said storage layer, in a direction parallel or antiparallel to the magnetization of the sense layer; and wherein said providing the first write data via the first field line comprises including the first write data in a first field current adapted to switch the magnetization of said storage layer in a direction orthogonal to the magnetization of the sense layer.

In another preferred embodiment, a method for searching a MRAM-based TCAM cell comprising: a first magnetic tunnel junction coupled with a first selection transistor and a second magnetic tunnel junction coupled with a second selection transistor; each magnetic tunnel junction being formed from a storage layer having a magnetization, a sense layer having a magnetization which direction is adjustable relative to the magnetization of the storage layer, and an insulating layer between the storage and sense layers; a sense line being coupled to the storage layer of each magnetic tunnel junction; a first field line and a second field line, both field lines being in communication with the storage and sense layers of the first and second magnetic tunnel junction, and the first field line being orthogonal to the second field line; the method comprising: during a write operation, providing a first write data to the storage layer of the first magnetic tunnel junction via the first or second field line; switching the magnetization of the first magnetic tunnel junction storage layer in a first direction corresponding to a first stored data; providing a second write data to the storage layer of the second magnetic tunnel junction via the first or second field line; switching the magnetization of the second magnetic tunnel junction storage layer in a second direction, opposed to the first direction, corresponding to a second stored data; and during a search operation, providing a search data to the sense layers of the first and second magnetic tunnel junctions, via the second field line; and determining the matching between the search data and the first and second stored data by measuring a magnetoresistance of the MRAM-based TCAM cell.

The present disclosure also pertains to the MRAM-based TCAM cell adapted to perform the method for writing and/or searching, where the second field line is adapted to pass the second field current for switching the magnetization of said storage layer in a direction parallel or antiparallel to the magnetization of the sense layer; characterized in that the first field line is adapted to pass a first field current for switching the magnetization of said storage layer in a direction orthogonal to the magnetization of the sense layer.

According to the embodiments, these aims are also achieved by means of a method for writing a write data bit in the MRAM-based TCAM cell comprising at least a first magnetic tunnel junction, said junction being formed from an insulating layer disposed between at least a storage layer and a sense layer, said storage layer being coupled with a sense line and having a magnetization direction, said sense layer having a magnetization direction; said cell also comprising a first field line parallel to the sense layer, and a second field line perpendicular to the first field line; the method comprising the step of:

providing a write data bit to said storage layer via the first field line switching said magnetization direction of said storage layer, parallel or antiparallel relative to the magnetization direction of said sense layer, in order to store a stored data bit with a high "1" or low "0" logic state in the junction; or the step of:

providing the write data bit to said storage layer via the second field line switching said magnetization direction of said storage layer, perpendicular to the magnetization direction of said sense layer, in order to store a stored data bit with a masked "X" logic state in the junction.

In an embodiment, said providing the write data bit to the storage layer via the first field line comprises including the write data bit in a first field current, and providing the write data bit to the storage layer via the second field line comprises including the write data bit in a second field current, the first and second field currents generating a first and second magnetic field, respectively, the magnetic field being able to switch said magnetization direction of said storage layer.

In another embodiment, the MRAM-based TCAM cell comprises a first selection transistor, the transistor being switched ON enabling to apply a junction current pulse through the junction via the sense line, in order to heat the junction until it reaches a predetermined high temperature threshold; then switching the transistor OFF to inhibit the current pulse allowing the junction to cool.

In yet another preferred embodiment, the ternary MRAM-based CAM cell also comprises a second selection transistor coupled with a second magnetic tunnel junction, adjacent to the first junction, and the writing method comprises the steps of:

storing a first stored data bit in the first junction with the first or second field current having a first polarity, in order to generate a magnetic field being orientated in a first direction;

storing a second stored data bit in the second junction with the first or second field current having a second polarity opposed to the first polarity, in order to generate a magnetic field being orientated in a second direction, opposed to the first direction.

In yet another embodiment, during said storing a first stored data bit, the first transistor is switched ON while the second transistor is switched OFF in order to selectively heat the first junction by flowing the junction current pulse only through the first junction; and during said storing a second stored data bit, the second transistor is switched ON while the first transistor is switched OFF in order to selectively heat the second junction by flowing the junction current pulse only through the second junction. These aims are also achieved by means of a method for searching a stored data bit in a ternary MRAM-based CAM cell, the method comprising the steps of:

a) providing a search data bit with a logic state varying between high "1" and low "0" to the sense layer via the second field line in order to vary accordingly the direction of said magnetization of said sense layer without switching completely its magnetization;

b) determining the magnetoresistance of the cell, in order to determine a match, mismatch or don't care configuration between the search and stored data bits.

In an embodiment, said providing the search data bit to the sense layer via the second field line comprises including the search data bit in the second field current having a small current amplitude and an alternating polarity, the second field current generating a second magnetic field being able to vary said magnetization direction of the sense layer without switching completely its magnetization.

In contrast with ternary content-addressable memory of the prior art, the MRAM-based CAM cell of the invention has a low-energy higher density with non-volatility and reduced power consumption.

Moreover, the design and manufacturing control of the MRAM-based CAM cell can be simplified. The MRAM-based CAM cell of the invention supports data mask operations, wherein data addresses are not associated with data during read operations.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
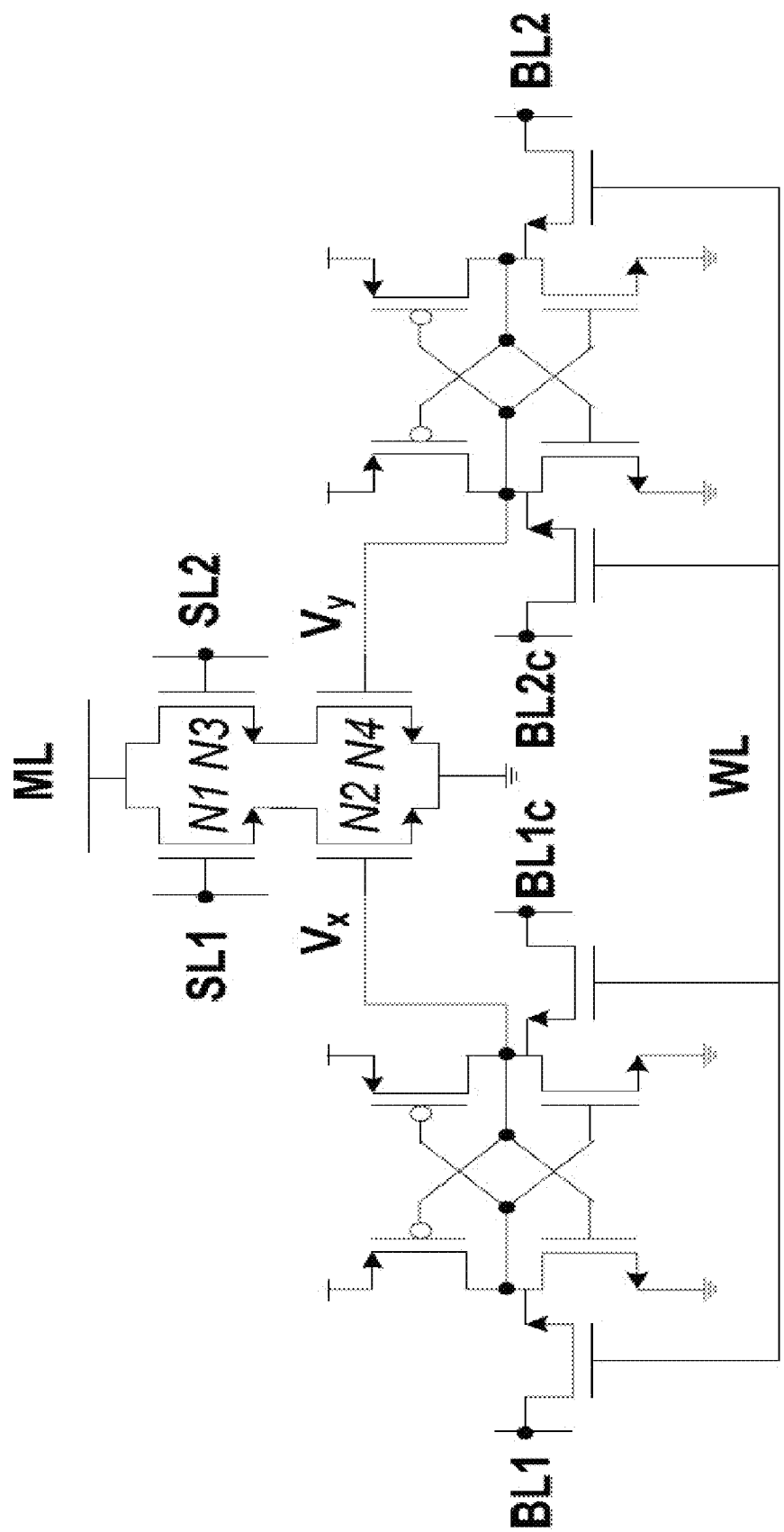
FIG. 1 is a schematic representation of a conventional state-of-the-art SRAM-based TCAM cell.
Figure 2:
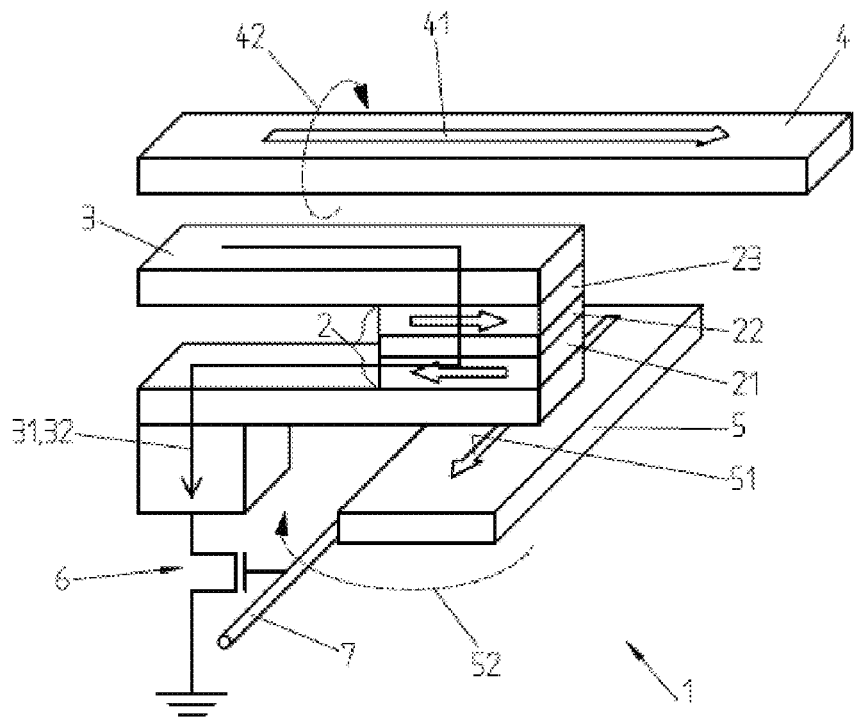
FIG. 2 is a ternary MRAM-based CAM cell comprising a junction, according to an embodiment of the invention.

A magnetic random access memory-based ternary content addressable memory (MRAM-based TCAM) cell 1 is shown in FIG. 2 in an embodiment of the invention. The MRAM-based TCAM cell 1 comprises a first magnetic tunnel junction 2, formed from an insulating layer 22 disposed between a storage layer 23 and a sense layer 21. Preferably, the storage layer 23 is made of a hard ferromagnetic material having a magnetization direction, while the sense layer 21 is made of a low coercivity, soft ferromagnetic material and has a magnetization direction that is adjustable relative to said magnetization of the storage layer 23. The ferromagnetic materials include typically iron, cobalt nickel or their alloys. Preferably, the insulating layer 22 is a thin layer, typically in the nanometer range and is formed, for example, from any suitable insulating material, such as alumina or magnesium oxide.

Figure 3:
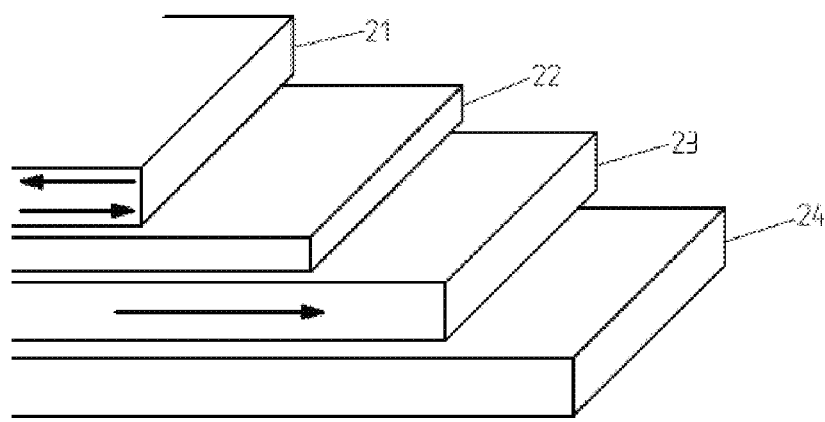
FIG. 3 is a schematic view of the junction comprising a storage and sense layers, according to an embodiment of the invention.

The first magnetic tunnel junction 2 can comprise any suitable number and/or arrangement of layers, including one or more layers having a composition different than the composition of the ferromagnetic layers 21 and 23. In the example of FIG. 3, the magnetic tunnel junction 2 comprises, in addition to the ferromagnetic layers 21, 23 and insulating layer 23, an antiferromagnetic pinning layer 24, placed below the storage layer 23. The pinning layer 24 is typically made of an antiferromagnetic material such as IrMn, PtMn or NiMn. Alternatively, the soft ferromagnetic layer 21 and the hard ferromagnetic layer 23 can also be configured in order to be used as a storage layer and a sense layer, respectively. The magnetic tunnel junction 2 can also contain more than one ferromagnetic layer. In the case of a write operation of the MRAM-based TCAM cell 1 based on a thermally-assisted switching (see below) procedure, the storage layer 23 is preferably a ferromagnetic/antiferromagnetic bi-layer formed using, for example, FeCo/PtMn and/or FeCo/IrMn alloys.

The magnetic tunnel junction 2 is placed between a sense line 3, coupling the storage layer 23, and a first selection transistor 6, controlled by a selection line, or word line 7. A first field line 4 is disposed on top of the first magnetic tunnel junction 2 and the sense line 3, and a second field line 5 is disposed below the first junction 2, in the vicinity of the sense layer 21. In a preferred configuration, the sense line 3 is orthogonal to the second field line 5 and parallel to the first field line 4. The sense line 3 can also be parallel and perpendicular to the second and first field line 5, 4, respectively. This implies that the first field line 4 is orthogonal to the second field line 5, both field lines 4, 5 being in communication with the storage and sense layers 21, 23.

The write operation of the MRAM-based TCAM cell 1 is based on a thermally-assisted switching (TAS) procedure, similarly to the one described in U.S. Pat. No. 6,950,335 and U.S. Patent Application Publication 2006/291276. The use of the TAS-based write procedure improves the overall performance of the MRAM-based TCAM cell 1, more particularly for reduced feature sizes and/or high densities.

More particularly, the write operation comprises the step of providing a first write data bit to said storage layer 23 via the second field line 5, where the first write data bit is included in a second field current 51, generating a second magnetic field 52 able to switch the magnetization direction of the storage layer 23 from a first stable direction to a second stable direction. Depending on the second field current 51 polarity, the magnetization of the storage layer 23 is switched according to an orientation direction that is parallel or antiparallel to the direction of the sense layer 21 magnetization, corresponding to a first stored data bit with a high logic state "1" or low logic state "0", respectively.

The first write data bit can also be provided to the storage layer 23 via the first field line 4, where the first write data bit is included in a first field current 41, generating a first magnetic field 42 able to switch the predetermined magnetization direction of the storage layer 23 from a first stable direction to a second stable direction. Here, the magnetization direction of the storage layer 23 becomes orthogonal to the direction of the sense layer 21 magnetization for both first field current 41 polarities, and corresponds to the first stored data bit with a masked logic state "X".

During the write operation described above, the selection transistor 6 is switched in the saturated mode (ON) using the word line 7, enabling to apply a junction current pulse 31 through the first junction 2 via the sense line 3, in order to heat the first magnetic tunnel junction 2. When the temperature of the magnetic tunnel junction 2 reaches a predetermined threshold or blocking temperature, the selection transistor 6 is switched OFF inhibiting the junction current pulse 31 and allowing the magnetic tunnel junction 2 to cool. During the cooling, the first or second magnetic field 42, 52 continues to be applied to the storage layer 23, until the temperature of the magnetic tunnel junction 2 reaches a predetermined low temperature threshold, at which the magnetization of the storage layer 23 is frozen in its new stored logic state.

According to a variant of the invention, a single-line MRAM cell is used to write the first write data bit using a TAS writing procedure, as described in U.S. Patent Application Publication 2009/251957.

According to another variant of the invention, the writing operation of the MRAM-based TCAM cell 1 is performed by using a spin polarized electric current or a current induced magnetic switching (CIMS), without using an external magnetic field. This writing procedure can be performed with or without a TAS-assisted write procedure. Such a CIMS writing operation has been experimentally demonstrated for metallic low sized (<100 nm) structures in the reference "Science, volume 285, page 867, 1999". In U.S. Pat. No. 5,695,864, a CIMS procedure is able to induce a precession or even a reversing of the magnetization of a magnetic layer with an adjustable magnetic orientation, by a transfer process of the angular spin moment between polarized carriers and the magnetic moment of the layer. Such architecture is highly scalable as the required current scales with the area of the cell 1. Furthermore this writing procedure is potentially very fast and does not require metal lines to generate magnetic field, hence reducing both the cell size and the drivers overhead.

CIMS-based writing operations can be advantageously combined with TAS-assisted write procedure as described in the case of a MRAM-based memory in U.S. Pat. No. 6,950, 335. In this case, the MRAM-based TCAM cell 1 can be written following the TAS-based writing sequence as described above, with the difference that no magnetic field is generated by the first or second field line 4, 5. Instead, the junction current pulse 31 is used to switch the magnetic orientation of the storage layer 23 by being appropriately spin-polarized while flowing through the first magnetic tunnel junction 2. This is done by adding specific magnetic layers for example, layers with perpendicular magnetization in the magnetic tunnel junction 2, as described in U.S. Pat. No. 6,603,677.

CIMS-based writing operations combined with the TAS-assisted write procedure allows for reduced write power consumption, particularly with small feature sizes. The readout remains similar to the one in the magnetic field-driven TCAM architecture.

During a search operation of the MRAM-based TCAM cell 1 of the invention, a search data bit with a high "1" or low "0" logic state is provided to the sense layer 21 via the second field line 5 in order to search the first stored data bit in the cell 1. The search data bit is included in a second field current 51 flowing through the second field line 5, generating a second magnetic field 52 able to switch the magnetization direction of the sense layer 21 according to the direction of the magnetic field 52, from a first stable direction to a second stable direction, depending on the logic state of the search data bit corresponding to the polarity of the second field current 51.

The magnetization direction of the sense layer 21 is then compared with the magnetization direction of the storage layer 23 by measuring the junction resistance R of the magnetic tunnel junction 2. This is performed by switching the first selection transistor 6 ON and flowing a sense current 32 though the first junction 2.

A low junction resistance R1 is measured in the magnetic tunnel junction 2 when the magnetization direction of the sense layer 21 is parallel to the magnetization direction of the storage layer 23, corresponding to both stored and search data bits having a high "1" or low "0" logic state, respectively. Here, the search data bit is in a match configuration with the first stored data bit. To the contrary, a high junction resistance R2 is measured when the magnetization direction of the sense layer 21 is antiparallel to the magnetization direction of the storage layer 23, corresponding to the first stored data bit with a high "1" or low "0" logic state and a search data bit with a low "0" or high "1" logic state, respectively. Here, the search data bit is in a mismatch configuration with the first stored data bit.

In the case of the first stored data bit having a masked logic state "X", the magnetization direction of the sense layer 21 is orthogonal to the magnetization direction of the storage layer 23 and an intermediate junction resistance R3, larger than R1 and lower than R2, is measured for the search data bit having either a high "1" or a low "0" logic state, corresponding to a "don't care" or masked configuration.

The MRAM-based TCAM cell 1 of the invention can then advantageously operate as a built-in exclusive-NOR (XNOR) circuit.

Figure 4:
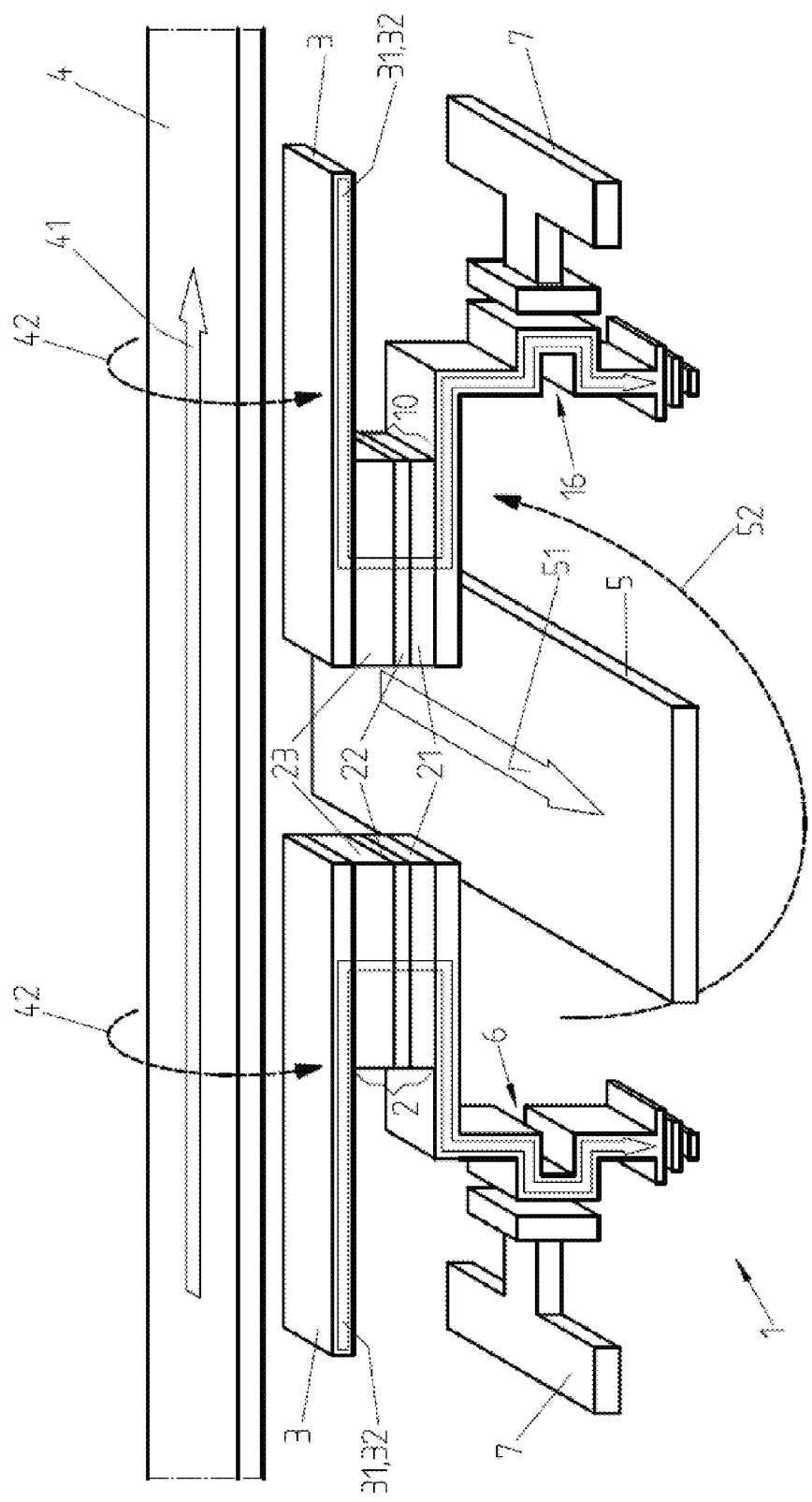
FIG. 4 is a ternary MRAM-based CAM cell comprising two junctions, in an preferred embodiment of the invention.

In a preferred embodiment of the invention represented in FIG. 4, the MRAM-based TCAM cell 1 also comprises a second selection transistor 16, controlled by another word line 7 and coupled with a second magnetic tunnel junction 10, adjacent to the first magnetic tunnel junction 2. The second magnetic tunnel junction 10 is also formed from a storage layer 23 having a magnetization, a sense layer 21 having a magnetization which direction is adjustable relative to the magnetization of the storage layer 23, and an insulating layer (22) between the storage and sense layers 23, 21. The two magnetic tunnel junctions 2, 10 are arranged such as to share the same first field line 4 and second field line 5, but can still be addressed by two distinct sense lines 3.

The writing operation of the two-junction MRAM-based TCAM cell 1 is performed by using the TAS-assisted write procedure described above, in a way to obtain a magnetization direction of the first magnetic tunnel junction 2 opposed to the one of the second magnetic tunnel junction 10. This is achieved by storing the first stored data bit in the first magnetic tunnel junction 2, using the first or second field current 41, 51 with a first polarity, generating a first or second magnetic field 42, 52, respectively, being orientated in a first direction; and storing a second stored data bit in the second magnetic tunnel junction 10, using the first or second field current 41, 51 with a second polarity opposed to the first polarity, generating a first or second magnetic field 42, 52, respectively, being orientated in a second direction, opposed to the first direction.

During the storing of the first stored data bit, the first selection transistor 6 is selectively switched ON while the second selection transistor 16 is switched OFF, in order to selectively heat the first magnetic tunnel junction 2 by flowing the junction current pulse 31 only through the first magnetic tunnel junction 2. During the storing of the second stored data bit, the second selection transistor 16 is selectively switched ON while the first selection transistor 6 is switched OFF in order to selectively heat the second magnetic tunnel junction 10 by flowing the junction current pulse 31 only through the second magnetic tunnel junction 10.

Figure 5:
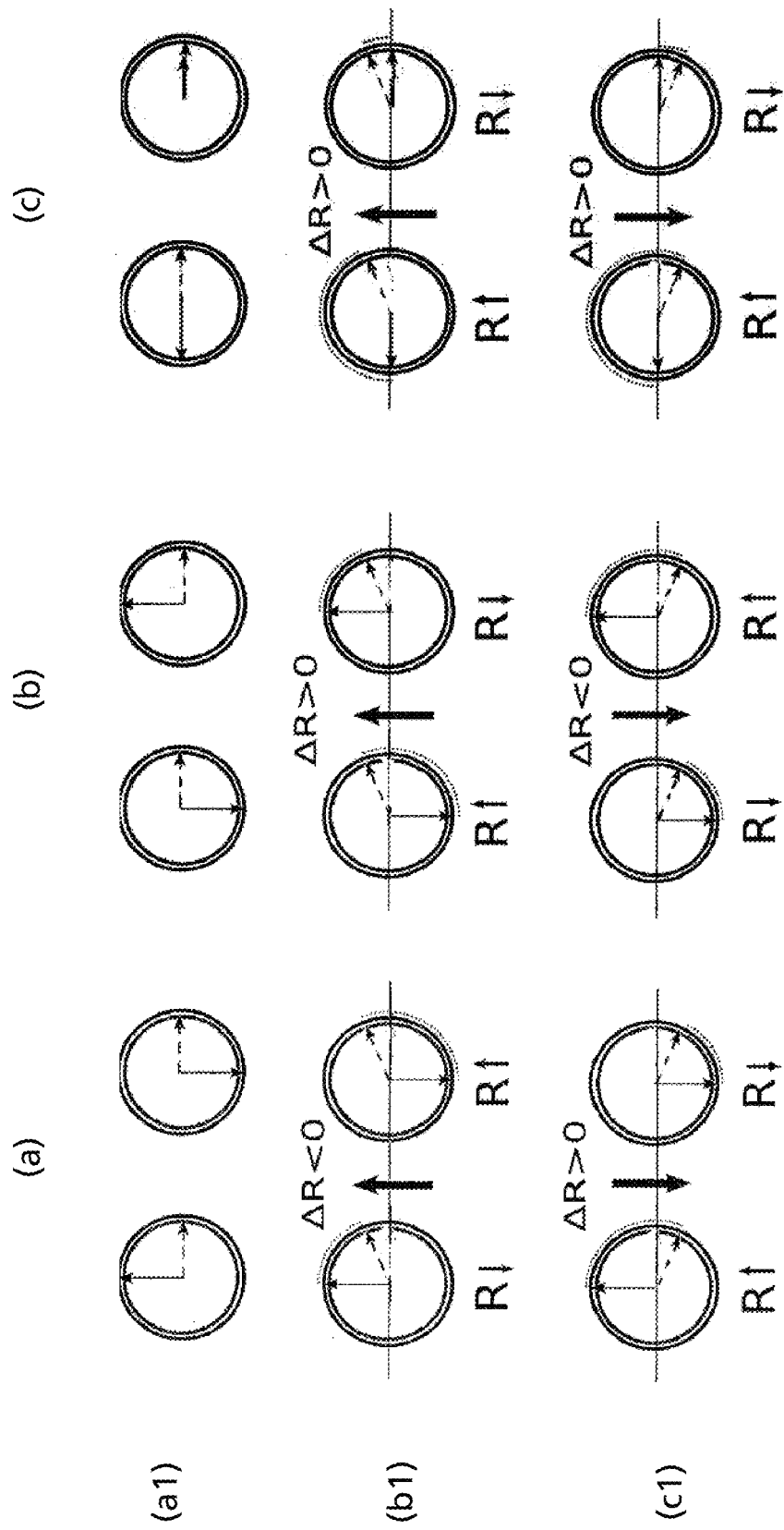
FIG. 5 is a schematic representation of the magnetization orientation of the storage and sense layers for the ternary MRAM-based CAM cell of FIG. 4.

FIG. 5 shows the magnetization of the storage layer 23, represented by the plain arrow, for the two adjacent magnetic tunnel junctions 2, 10, represented viewed from top by the circles. The direction of the storage layer 23 magnetization of the first magnetic tunnel junction 2 is opposed to the one of the second magnetic tunnel junction 10 for the first stored data having a logic state of "1", shown in column (a), "0", shown in column (b), and "X", shown in column (c).

In the case of a the field line 5 is provided in a U-shape geometry, as described in patent application WO2008040561 and not represented here, the two-junction MRAM-based TCAM cell 1 can be written such as to have opposite magnetization directions in the first and second magnetic tunnel junctions 2, 10 in a single step.

The search operation of the two-junction MRAM-based TCAM cell 1 is performed by providing the search data bit with a logic state varying between a predetermined high "1" and low "0" value, for example in a continuous fashion, to the sense layer 21 via the second field line 5, in order to vary accordingly the direction of the magnetization of the sense layer 21 without switching completely its magnetization. The search data bit is included in the second field current 51 having a small current amplitude and an alternating polarity, and generating a second magnetic field 52 being able to switch the magnetization direction of the sense layer 21.

Similarly to the search operation described above, the junction resistance R is then measured for the two magnetic tunnel junctions 2, 10 and the difference between the two measured resistances, also called tunnel magnetoresistance, or magnetoresistance ΔR of the cell 1, is used to determine the matching of search data bit with the first and second stored data bits. This method is also called differential search procedure. More particularly, this is performed by successively measuring the junction resistance R of each of the magnetic tunnel junctions 2, 10 by successively switching ON one the selection transistors 6, 16 and applying the sense current 32 though the magnetic tunnel junction 2, 10 corresponding to the transistor being ON, while keeping the other selection transistor OFF. For example, the first selection transistor 6 is switched ON and the sense current 32 flows though the first magnetic tunnel junction 2, allowing measuring the resistance of the magnetic tunnel junction 2. During this measurement, the second selection transistor 16 is switched OFF. The second selection transistor 16 is then switched ON while the first selection transistor 6 is turned OFF, in order to flow the sense current 32 though the second magnetic tunnel junction 16 and measure the junction resistance R of the second magnetic tunnel junction 16.

The orientation of the sense layer 21 magnetization during the searching operation is shown by the dashed arrows in FIG. 5. Prior to the search operation (initial condition shown in row (a1) in FIG. 5), no field current is flowing and the orientation of the sense layer 21 magnetization is oriented in the same direction for the two magnetic tunnel junctions 2, 10, for all stored data bit logic states.

During a search operation with the search data bit having a logic state of "0" (row (b1) in FIG. 5), the small second field current 51 induces the second magnetic field 52, oriented upward in FIG. 5, orienting the sense layer 21 magnetization in a direction slightly upward, compared to its orientation in the initial condition. In the case of the first stored data bit of "1", the direction of the sense layer 21 magnetization becomes closer to the one of the storage layer 23 for the first magnetic tunnel junction 2 and farther for the second magnetic tunnel junction 10 (second stored data bit of "0"). Here, the junction resistance R measured in the first magnetic tunnel junction 2 is smaller than the one measured in the second magnetic tunnel junction 10, yielding a negative tunnel magnetoresistance ($\Delta R < 0$), and a mismatched search data bit. In the case of the first stored data bit of "0", the direction of the sense layer 21 magnetization becomes farther to the one of the storage layer 23 for the first magnetic tunnel junction 2 and closer for the second magnetic tunnel junction 10 (second stored data bit of "1"), and the junction resistance R measured in the first magnetic tunnel junction 2 is larger than the one measured in the second magnetic tunnel junction 10, yielding a positive tunnel magnetoresistance ($\Delta R > 0$), and a matched search data bit.

During a search operation with the search data bit having a logic state of "1" (row (c1) in FIG. 5), the small second field current 51 induces the second magnetic field 52, oriented downward in FIG. 5, orienting the sense layer 21 magnetization in a direction slightly downward, compared to its orientation in the initial condition. Similarly to the description above, in the case of the first stored data bit of "1" (and second stored data bit of "0"), the direction of the sense layer 21 magnetization in the two magnetic tunnel junctions 2, 10 yields a positive tunnel magnetoresistance, and a matched search data bit, while for the first stored data bit of "0" (and second stored data bit of "1"), the direction of the sense layer 21 magnetization in the two magnetic tunnel junctions 2, 10 yields a negative tunnel magnetoresistance, and a mismatched search data bit.

In the case of the first stored data bit with a logic state of "X" (and second stored data bit of "X"), the sense layer 21 magnetization becomes farther to the magnetization of the storage layer 23 for the first magnetic tunnel junction 2 and closer for the second magnetic tunnel junction 10 for the search data bit with a logic state of "0" and "1", respectively, resulting in a positive magnetoresistance and a matched search data bit for both logic states. This corresponds to a masked, or don't care, condition.

The differential search procedure using the two-junction MRAM-based TCAM cell 1 allows performing a search operation without having to fully switch the magnetization direction of the sense layer 21, enabling high-speed search operations. Moreover, the small second field current 51 used, typically having a magnitude of about 700 μA or less, is much smaller than the current magnitude of about 15 mA or larger, required to completely switch the sense layer magnetization, resulting in a reduced power consumption. Power consumption can also be reduced by minimizing the switching energy of the sense layer 21.

The MRAM-based TCAM cell 1 further provides data storage and search functionalities with intrinsic nonvolatility and high-density. The MRAM-based TCAM cell 1 can be easily and cost effectively scaled down, since the call requires a minimum of surface area on an integrated circuit substrate.

Figure 6:
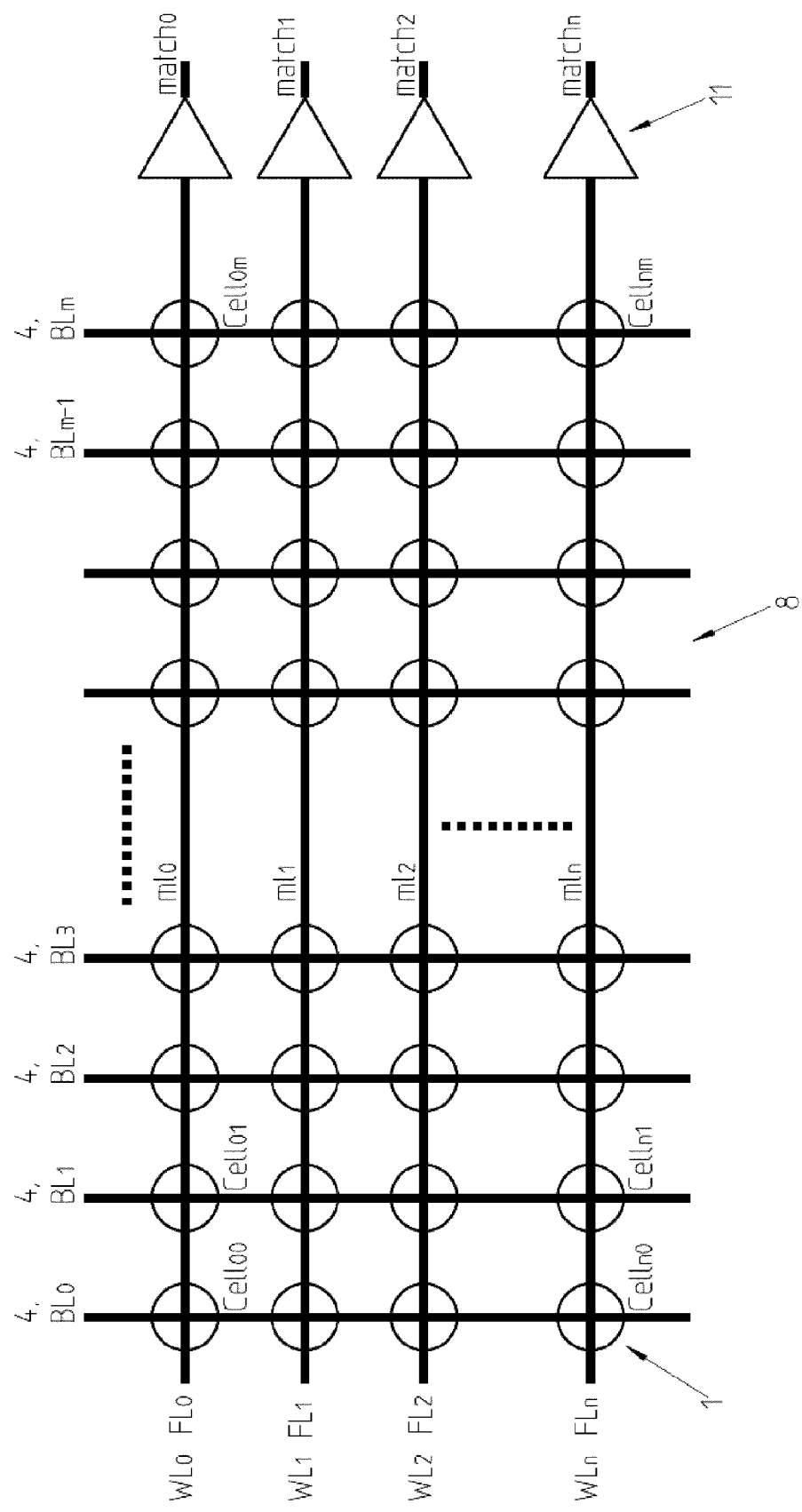
FIG. 6 is a memory array comprising several MRAM-based CAM cells of FIG. 2 or 4.
Figure 7:
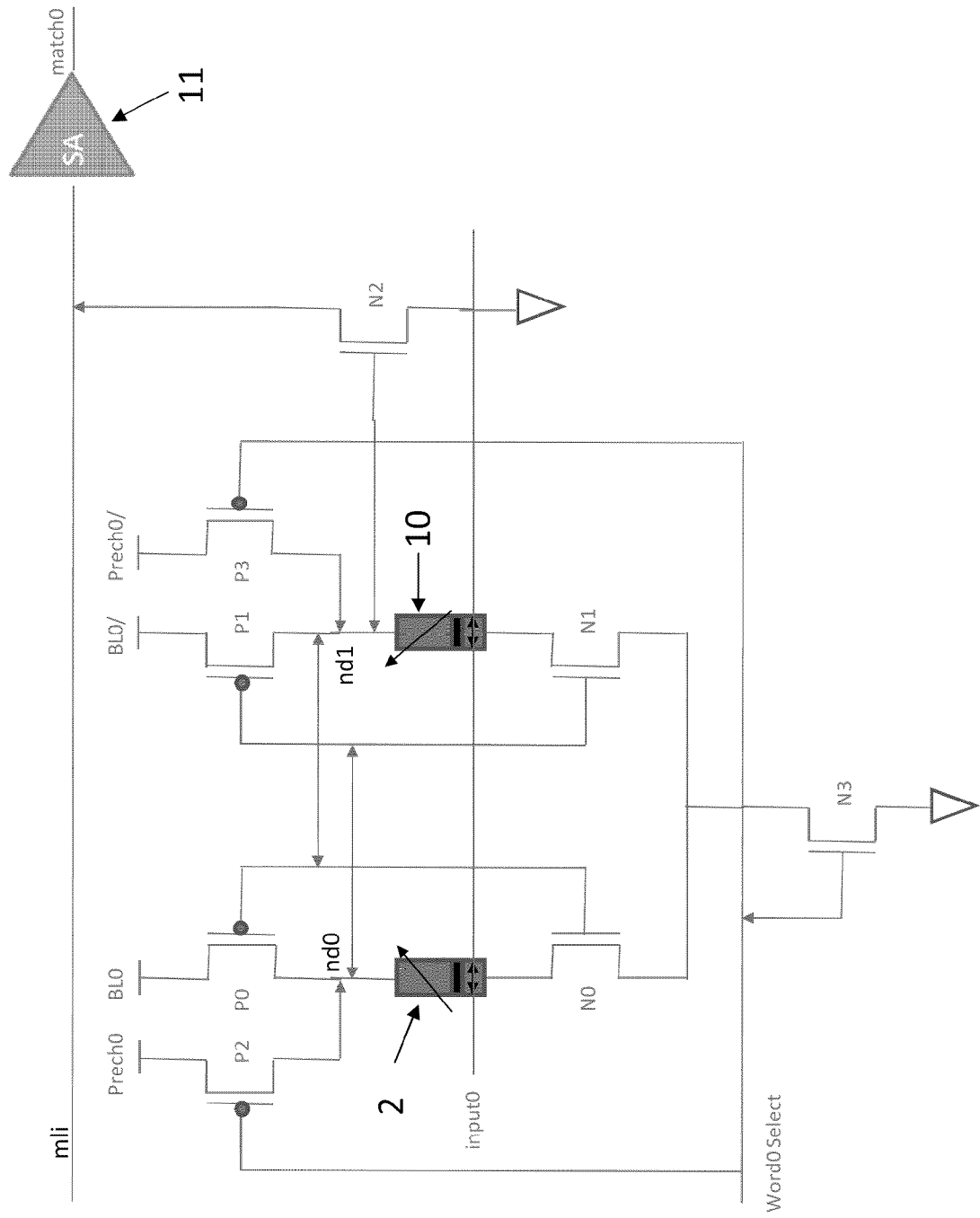
FIG. 7 shows a MRAM-based CAM cell comprising a pre-amplifier according to an embodiment of the invention.
Figure 8:
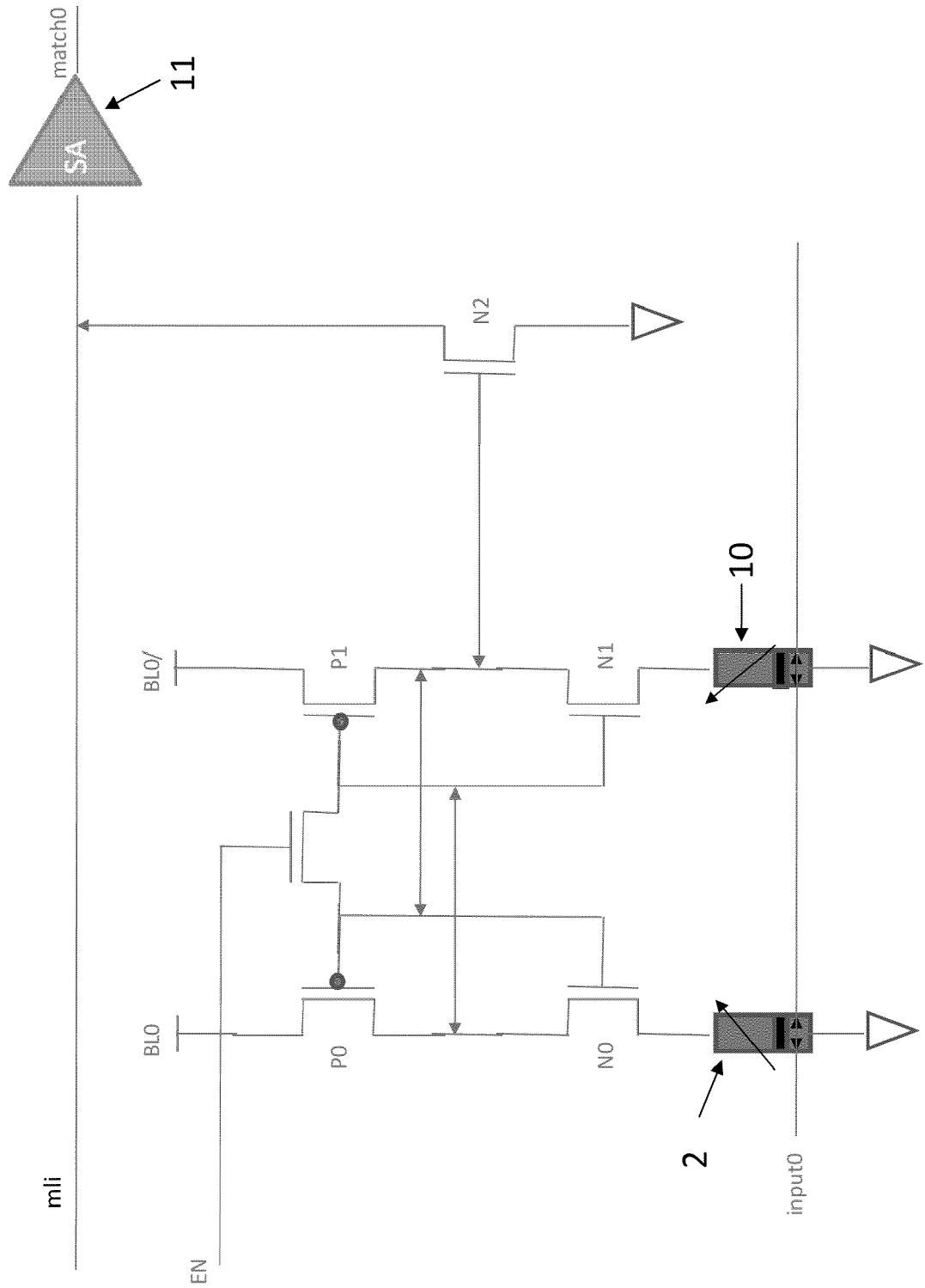
FIG. 8 shows a MRAM-based CAM cell comprising a pre-amplifier according to another embodiment of the invention.

A memory array 8 is represented in FIG. 6. The memory array 8 comprises a matrix of several MRAM-based TCAM cells 1 (also represented by the symbols $Cell_{00}$ to $Cell_{nm}$ in the figure) arranged in rows and columns. Each row of the array 8 comprises one word line 7, each word line 7 being identified by the symbols $WL_0$ to $WL_n$ in FIG. 6, and one second field line 5, each field line being also identified with the symbols $FL_0$ to $FL_n$. Each column of the array 8 comprises one sense line 3, or bit line, each bit line being identified by the symbols $BL_0$ to $BL_m$, and one first field line 4, each column being preferably arranged perpendicular to the word lines $WL_i$ and/or field lines $FL_i$. The memory array 8 comprises also several match lines represented by the symbols $ml_0$ to $ml_n$ in FIG. 6, each match line $ml_i$ being associated through a pull down transistor N2 (as shown in FIGS. 7 and 8) with a row of the array 8. Each match line $ml_i$ is coupled to a match line amplifier 11 able to amplify the signals to a full logic level and provide output signals ($match_0$ to $match_n$) in a conventional manner. The match line amplifier 11 can be a differential sense amplifier and/or a multistage differential sense amplifier, in order to perform a matching operation.

In the example of FIG. 6, the memory array 8 comprises [n+1]×[m+1] MRAM-based TCAM cells 1, where [n+1] represents the number of word lines $WL_i$ (rows) and [m+1] represents the number of bit lines $BL_i$ (columns); the numbers of row and columns depending on the capacity and configuration of the memory array 8.

Each sense line $BL_i$ is also coupled with an end-of-line amplifier (not represented) at one of its extremity in order to measure the current value used to measure the junction resistance. The end-of-line amplifiers enable the memory array 8 to provide one-state full-word readout and/or comparison.

The MRAM-based TCAM cell 1, or two-junction MRAM-based TCAM cell 1, can further comprise a local pre-amplifier (FIGS. 7 and 8) configured as a local sense amplifier or otherwise, as shown in the examples of FIGS. 7 and 8. The local sense amplifier can be a latch-based (FIG. 8) or Flip-Flop-based (FIG. 7) local pre-amplifier. In the example of FIG. 7, the Flip-Flop-based local pre-amplifier comprises the P-channel MOSFET transistors P0, P1, P2, P3 and the N-channel MOSFET transistors N0, N1, N3, where the transistors P0, P2 and N0 are connected to the first magnetic tunnel junction 2, and the transistors P1, P3 and N1 are connected to the second magnetic tunnel junction 10. In FIG. 8, the latch-based local pre-amplifier comprises the P-channel MOSFET transistors P0, P1 and the N-channel MOSFET transistors N0 and N1, the transistors P0 and N0 being connected to the first magnetic tunnel junction 2 and the transistors P1 and N1 being connected to the second magnetic tunnel junction 10. The exemplary local pre-amplifiers shown in FIGS. 7 and 8 are arranged such that the first and second magnetic tunnel junctions 2, 10 can communicate with at least one match line $ml_i$ via the local pre-amplifier, and each match line $ml_i$ is associated with one local pre-amplifier.

The MRAM-based TCAM cell 1 or two-junction MRAM-based TCAM cell 1 can also be coupled with a conventional static random access memory (SRAM) cell configured to operate as an integrated sense amplifier, for example, as an integrated amplifier of the junction resistance R value. The integrated amplifier can advantageously be applied to the MRAM-based TCAM cell 1 or to the two-junction MRAM-based TCAM cell 1 operating according to the differential search procedure.

During the write operation of the memory array 8, a write data word, comprising several write data bits, possibly having different "1", "0" and/or "X" logic states, is sent through selected field lines $FL_i$ while the heating junction current pulse 31 is sent to the selected sense lines, or bit lines $BL_i$. During the write operation, the local pre-amplifiers associated with each selected match line $ml_i$ are disabled. Each write data bit of the write data word is then written and stored into the selected MRAM-based TCAM cell 1 using the write operation described above.

The two-junction MRAM cell 1 can be written sequentially where the bit lines $BL_1$ corresponding to the same predetermined logic state ("1" or "0") are selected during the first or the second write cycle, respectively. For example, during the first write cycle each bit line $BL_i$ corresponding to the same write data bit logic state are selected ("1" for example). Then a pulse current corresponding to a write logic state "1" is applied simultaneously trough the field lines $FL_i$ in the same manner to all MRAM-based TCAM cells 1. Similarly, during the second write cycle, a pulse current corresponding to the write logic state "0" is applied when the bit lines corresponding to write data bit "0" are selected.

During the search operation, a search data word comprising several search data bits, possibly having different "1" and/or "0" logic states, is sent through the selected field lines $FL_i$ while flowing the sense current 32 though the selected bit lines $BL_i$.

In an embodiment of the invention, one field line $FL_i$ is able to address simultaneously one, several or all cell rows or column of the array 8.

More particularly, during the search operation, the match lines $ml_i$ are pre-charged to the high logic state (Vdd), and an enable signal, represented by the symbol EN in FIG. 8, assumes the high logic state. The bit lines represented by the symbols BL0 and BL0/ in FIGS. 7 and 8, are activated and the second field current 51 corresponding to the search data bit is applied to the second field line 5, inducing the second magnetic field 52 in the second field line 5, as described above. The latch-based local pre-amplifier formed by the P-channel MOSFETs P0, P1 and the N-channel MOSFETs N0, N1 thereby becomes unbalanced, enabling the local pre-amplifier system to sense the differential magnetic state of the two magnetic tunnel junctions 2, 10. If the two magnetic tunnel junctions 2, 10 contain the stored data bit having a logic state "0", the match line $ml_i$ remains at the pre-charged logic state. The potential on the match line $ml_i$ drops to the logic state "0" if the stored data bit has a logic state of "1".

Similarly, in the example of FIG. 8, the bit lines BL0, BL0/ of the flip-flop-based local pre-amplifier are activated and the nodes nd0, nd1 are pre-charged to the voltage value applied respectively to the pre-charged lines prech0, Prech1. When the enable signal EN (Word0 Select in FIG. 7) is set to a low logic state, the node nd0, nd1 are pre-charged to a predetermined value and the current pulse corresponding to the search data bit is applied to the second field line 5. The flip-flop-based local pre-amplifier formed by the P-channel MOSFETs P0, P1, P2, P3 and the N-channel MOSFETs N0, N1, N3 becomes unbalanced, enabling to measure the differential magnetic state of the two magnetic tunnel junctions 2, 10.

The sense amplifier associated with each selected match line $ml_i$ can be enabled and all rows of the memory array 8 selected, by applying a voltage (or current) to the associated word line $WL_i$. Each search data bit of the search data word applies a predetermined voltage corresponding to the logic state stored in the search data bit. The sense current 31 is then applied through the field lines $Fl_i$, simultaneously and in a similar manner to all MRAM-based TCAM cells 1. The second field current 51 induces the second magnetic field 52 in the field lines $FL_i$ and aligns the magnetization of the sense layer 21 in order to measure the junction resistance R of the MRAM-based TCAM cell 1.

The MRAM-based TCAM cell 1 can be written and searched simultaneously. For example, the memory array 8 can write and store data as registered data with an address that can be simultaneously searched by comparing search data with the stored registered data.

REFERENCE NUMBERS AND SYMBOLS

1 MRAM-based TCAM cell
2 first magnetic tunnel junction
21 sense layer
22 insulating layer
23 storage layer
24 antiferromagnetic pinning layer
31 junction current pulse,
32 sense current
3 sense line, bit line
4 first field line
41 first field current
42 first magnetic field
5 second field line
51 second field current
52 second magnetic field
6 first selection transistor
7 selection line, word line
8 memory array
9 end-of-line amplifier
10 second magnetic tunnel junction
11 match line amplifier
16 second selection transistor
$BL_i$ sense line, bit line
$FL_i$ second field line
H magnetic field
$ml_i$ match line
$Match_i$ output signal
P0 to P3 P-channel MOSFET transistors
nd0, nd1 nodes
N2 pull down transistor
N0, N1, N3 N-channel MOSFET transistors
R junction resistance
R1 low junction resistance
R2 high junction resistance
R3 intermediate junction resistance
ΔR magnetoresistance
$WL_i$ selection line, word line

What is claimed is:

1. A method for writing a magnetic random access memory-based ternary content addressable memory (MRAM-based TCAM) cell comprising:
a first magnetic tunnel junction being formed from a storage layer having a magnetization, a sense layer having a magnetization direction adjustable relative to the magnetization of the storage layer, and an insulating layer between the storage and sense layers;
a sense line coupled with the storage layer;
a first field line and a second field line, both field lines being in communication with the storage and sense layers, and the first field line being orthogonal to the second field line;
comprising:
providing a first write data to said storage layer via the second field line to store a first stored data with a high or low logic state; and
providing the first write data to said storage layer via the first field line to store the first stored data with a masked logic state.

2. The method according to claim 1, wherein
said providing the first write data via the second field line comprises including the first write data in a second field current adapted to switch the magnetization of said storage layer, in a direction parallel or antiparallel to the magnetization of the sense layer;
and wherein
said providing the first write data via the first field line comprises including the first write data in a first field current adapted to switch the magnetization of said storage layer in a direction orthogonal to the magnetization of the sense layer.

3. The method according to the claim 1 or 2, wherein
said providing the first write data further comprises heating the first magnetic tunnel junction at a predetermined threshold temperature.

4. The method according to claim 3, wherein
the MRAM-based TCAM cell further comprises a first selection transistor coupled with the first magnetic tunnel junction, and wherein
said heating the first magnetic tunnel junction comprises activating said first selection transistor and applying a junction current pulse to said first magnetic tunnel junction via the first selection transistors.

5. A method for searching a magnetic random access memory-based ternary content addressable memory (MRAM-based TCAM) cell comprising:
a first magnetic tunnel junction coupled with a first selection transistor and a second magnetic tunnel junction coupled with a second selection transistor; each magnetic tunnel junction being formed from a storage layer having a magnetization, a sense layer having a magnetization which direction is adjustable relative to the magnetization of the storage layer, and an insulating layer between the storage and sense layers;
a sense line being coupled to the storage layer of each magnetic tunnel junction;
a first field line and a second field line, both field lines being in communication with the storage and sense layers of the first and second magnetic tunnel junction, and the first field line being orthogonal to the second field line;
the method comprising:
during a write operation,
providing a first write data to the storage layer of the first magnetic tunnel junction via the first or second field line;
switching the magnetization of the first magnetic tunnel junction storage layer in a first direction corresponding to a first stored data;
providing a second write data to the storage layer of the second magnetic tunnel junction via the first or second field line;
switching the magnetization of the second magnetic tunnel junction storage layer in a second direction, opposed to the first direction, corresponding to a second stored data; and
during a search operation,
providing a search data to the sense layers of the first and second magnetic tunnel junctions, via the second field line; and
determining if the search data and the first and second stored data match or mismatch, or if the first and second stored data have a masked logic state, by measuring a magnetoresistance of the MRAM-based TCAM cell.

6. The method according to claim 5, wherein
said providing the first and second write data via the second field line comprises including the first and second write data in a second field current having, respectively, a first polarity and a second polarity opposed to the first polarity; the second field current being adapted to switch the magnetization of said storage layer in a direction parallel or antiparallel to the magnetization of the sense layer according to the second field current polarity;
and wherein
said providing the first and second write data via the first field line comprises including the first and second write data in a first field current having, respectively, a first polarity and a second polarity opposed to the first polarity; the first field current being adapted to switch the magnetization of said storage layer in a direction orthogonal to the magnetization of the sense layer according to the first field current polarity.

7. The method according to the claim 5 or 6, wherein
said providing the first and second write data to the storage layer further comprises selectively heating the first and second magnetic tunnel junction, respectively, at a predetermined threshold temperature.

8. The method according to claim 7, wherein
said selectively heating the first and second magnetic tunnel junction comprises selectively activating said first and second selection transistor, respectively, and applying a junction current pulse to said first and second magnetic tunnel junctions via the first and second selection transistors, respectively.

9. The method according to claim 5, wherein
said providing the search data comprises including the search data in the second field current; the field current having a small current amplitude and an alternating polarity, and being adapted to vary the direction of the sense layer magnetization in accordance with its alternating polarity.

10. The method according to any of the claims from 5 or 9, wherein
said measuring the magnetoresistance comprises:
selectively activating said first and second selection transistor; and
applying a sense current through the first and second magnetic tunnel junction via the selectively activated first and second selection transistors, respectively; and
measuring the junction resistance of the first and second magnetic tunnel junction, respectively.

11. A magnetic random access memory-based ternary content addressable memory (MRAM-based TCAM) cell; the MRAM-based TCAM cell comprising a first and second magnetic tunnel junction coupled with a first and second selection transistor, respectively; each magnetic tunnel junction being formed from a storage layer having a magnetization, a sense layer having a magnetization which direction is adjustable relative to the magnetization of the storage layer, and an insulating layer between the storage and sense layers; the MRAM-based TCAM cell also comprising a second field line in communication with the storage layer, and adapted to pass a second field current for switching the magnetization of said storage layer in a direction parallel or antiparallel to the magnetization of the sense layer; the MRAM-based TCAM cell further comprises a first field line also in communication with the storage layer and orthogonal to the second field line, the first field line being adapted to pass a first field current for switching the magnetization of said storage layer in a direction orthogonal to the magnetization of the sense layer.

12. A memory array comprising a matrix containing a plurality of magnetic random access memory-based ternary content addressable memory (MRAM-based TCAM) cells, each MRAM-based TCAM cell comprising a first and second magnetic tunnel junction coupled with a first and second selection transistor, respectively; each magnetic tunnel junction being formed from a storage layer having a magnetization, a sense layer having a magnetization which direction is adjustable relative to the magnetization of the storage layer, and an insulating layer between the storage and sense layers; a second field line in communication with the storage layer, and adapted to pass a second field current for switching the magnetization of said storage layer in a direction parallel or antiparallel with the magnetization of the sense layer; and a first field line also in communication with the storage layer and orthogonal with the second field line, the first field line being adapted to pass a first field current for switching the magnetization of said storage layer in a direction orthogonal with the magnetization of the sense layer.

13. The memory array according to claim 12, wherein the MRAM-based TCAM cells are arranged in rows and columns and wherein
each row comprises at least one word line controlling the first selection transistor, one first field line, one sense line, one second field line, the first field line and sense line being orthogonal to the word line and second field line.

14. The memory array according to the claim 12 or 13, wherein
each row further comprises at least one match line, a pull down transistor and a match line amplifier, each of said at least one match line being in communication with the MRAM-based TCAM cells in a row or column through the pull down transistor and coupled to the match line amplifier.

15. The memory array according to claim 12, wherein
one second field line is able to address simultaneously one, several or all MRAM-based TCAM cells of the array.

* * * * *